United States Patent
Lewis

(10) Patent No.: US 9,893,732 B1
(45) Date of Patent: Feb. 13, 2018

(54) TECHNIQUES FOR BYPASSING DEFECTS IN ROWS OF CIRCUITS

(71) Applicant: Intel Corporation, Santa Clara, CA (US)

(72) Inventor: David Lewis, Toronto (CA)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/389,292

(22) Filed: Dec. 22, 2016

(51) Int. Cl.
  *H03K 19/003* (2006.01)
  *H03K 19/173* (2006.01)
  *H03K 19/177* (2006.01)

(52) U.S. Cl.
  CPC . *H03K 19/17764* (2013.01); *H03K 19/00392* (2013.01); *H03K 19/17736* (2013.01)

(58) Field of Classification Search
  CPC ....... H03K 19/17764; H03K 19/00392; H03K 19/17736
  USPC ...................................... 326/10, 38
  See application file for complete search history.

(56) References Cited

U.S. PATENT DOCUMENTS

| 6,201,404 | B1 | 3/2001 | Reddy et al. |
| 6,965,249 | B2 | 11/2005 | Lane et al. |
| 7,180,324 | B2 | 2/2007 | Chan et al. |
| 7,215,140 | B1 * | 5/2007 | Saini ................ H03K 19/17732 326/12 |
| 7,772,872 | B2 * | 8/2010 | Lewis .............. H03K 19/00392 326/10 |
| 8,860,460 | B1 * | 10/2014 | Cashman ......... H03K 19/17736 326/38 |
| 2008/0218197 | A1 * | 9/2008 | Lewis .............. H03K 19/00392 326/10 |

* cited by examiner

*Primary Examiner* — Daniel D Chang
(74) *Attorney, Agent, or Firm* — Steven J. Cahill

(57) ABSTRACT

An integrated circuit includes rows of circuits. A first region of the integrated circuit includes a first portion of each of the rows of circuits, and a second region of the integrated circuit includes a second portion of each of the rows of circuits. The integrated circuit shifts functions for a first subset of the rows of circuits to a second subset of the rows of circuits in the first region based on a first defect in a first one of the rows of circuits in the first region. The integrated circuit shifts functions for a third subset of the rows of circuits to a fourth subset of the rows of circuits in the second region based on a second defect in a second one of the rows of circuits in the second region.

20 Claims, 10 Drawing Sheets

TECHNIQUES FOR BYPASSING DEFECTS IN ROWS OF CIRCUITS

FIELD OF THE DISCLOSURE

The present disclosure relates to electronic circuits, and more particularly, to techniques for bypassing defects in rows of circuits in an integrated circuit.

BACKGROUND

Programmable logic integrated circuits (ICs), such as field programmable gate arrays (FPGAs) and programmable logic devices (PLDs), typically include blocks of programmable logic circuits. All integrated circuits are susceptible to manufacturing defects. In order to increase production yields, programmable logic ICs may be provided with spare or redundant circuits. Programmable logic ICs having redundant circuitry can help improve production yields by repairing defective regions on the ICs by engaging the redundant circuitry. A row based redundancy scheme typically provides at least one redundant or "spare" row for several rows of programmable logic circuits and its associated routing. Typically, a repairable region may be above the redundant row such that, if one of the rows of the programmable logic circuits is defective, the redundant row is activated and each row from the redundant row to the defective row replaces the next higher row, thus repairing the defective row.

BRIEF SUMMARY

An integrated circuit includes rows of circuits. A first region of the integrated circuit includes a first portion of each of the rows of circuits. A second region of the integrated circuit includes a second portion of each of the rows of circuits. The integrated circuit shifts functions for a first subset of the rows of circuits to a second subset of the rows of circuits in the first region based on a first defect in a first one of the rows of circuits in the first region. The first one of the rows of circuits is disabled only in the first region. The integrated circuit shifts functions for a third subset of the rows of circuits to a fourth subset of the rows of circuits in the second region based on a second defect in a second one of the rows of circuits in the second region. The second one of the rows of circuits is disabled only in the second region. The second one of the rows of circuits is different than the first one of the rows of circuits. The third subset of the rows of circuits includes at least some of the rows of circuits in the first subset.

Various embodiments of the present invention can be implemented in numerous ways, such as a process, an apparatus, a system, a device, or a method. Several embodiments are described below. Various objects, features, and advantages of the present invention will become apparent upon consideration of the following detailed description and the accompanying drawings.

DETAILED DESCRIPTION

As discussed above, many programmable logic ICs implement redundancy by using a row based architecture, in which each row contains an identical set of programmable resources. The programmable routing fabric is designed such that connections between rows of programmable logic circuits have duplicate connections, not visible to the user design, that enable shifting. Shifting allows the programming of one row to be shifted down to the row below it, and maintain the exact logical functionality. In response to a defect being detected in a row of programmable logic circuits in a programmable logic IC, the row in which the defect lies is disabled, and all programming for that row and each subsequent row is shifted down by one row, such that a redundant row is now able to be programmed to implement part of a user design for the IC.

Redundancy has a tradeoff between the number of defects that can be repaired and the cost of the redundant rows, and consequently the die area. In existing PLD and FPGA architectures, each redundant row can only repair a defect in one row, so that a larger number of redundant rows can repair defects in more rows, but at the cost of more circuit area for the additional redundant rows. Each redundant row spans the entire width of the IC, and each redundant row occupies the width of the integrated circuit die times the height of a row. Thus, providing additional redundant rows of programmable logic circuits in an integrated circuit to repair defects in more rows typically requires a significant amount of additional die area.

According to some embodiments of the present invention disclosed herein, techniques are provided for reducing the cost of redundancy by enabling more defects to be repaired for a given amount of spare logic. An integrated circuit (IC) is divided into a set of regions. Redundancy is provided within each of the regions of the IC. The IC may have one, two, or more regions along the vertical axis of the IC and one, two, or more regions along the horizontal axis of the IC. Redundancy shifting of rows of circuits takes place independently within each region, including between horizontally adjacent regions in the IC. In response to a defect being detected in a row of circuits within one of the regions, the row in which the defect lies is disabled only in that region, and all programming for that row and each subsequent row within that region is shifted down by one row, such that a spare or redundant row within that region is now able to be programmed to implement part of a user design for the IC.

Figure 1:
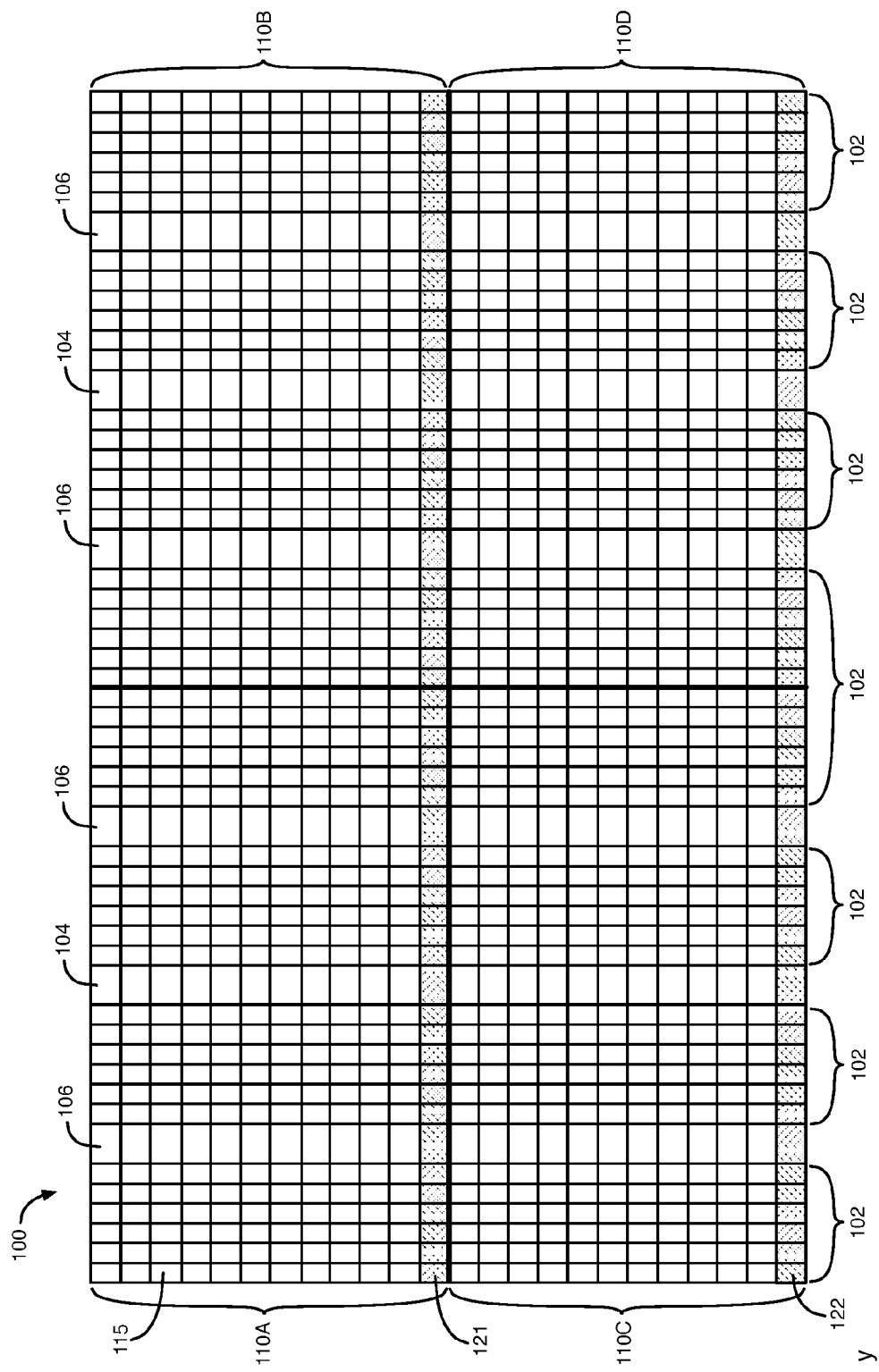
FIG. 1 illustrates an example of an integrated circuit (IC) having redundant rows of circuits that are independently controllable within each region of the IC, according to an embodiment.

FIG. 1 illustrates an example of an integrated circuit (IC) 100 having redundant rows of circuits that are independently controllable within each region of the IC, according to an embodiment. IC 100 may be a programmable logic integrated circuit (IC), such as a field programmable gate array (FPGA) or a programmable logic device (PLD), or another type of IC having some programmable circuitry. IC 100 includes several circuits that are arranged in 24 horizontal rows and 54 vertical columns in the top down view of FIG. 1. 24 rows and 54 columns of circuits are shown in FIG. 1 merely as an example. An IC having any of the embodiments disclosed herein may have any number of rows of circuits and any number of columns of circuits.

IC 100 includes 48 vertical columns 102 of programmable logic circuit blocks, two vertical columns 104 of digital signal processing (DSP) circuits 104, and four vertical columns 106 of memory circuits. The numbers of these columns are provided merely as examples and are not intended to be limiting. Each rectangular box within each of these columns represents a programmable logic circuit block, a DSP circuit, or a memory circuit. Each horizontal row of circuits in IC 100 includes programmable logic circuit blocks, DSP circuits, and memory circuits. One of these horizontal rows is identified as row 115 in FIG. 1 as an example.

IC 100 also includes two redundant rows 121 and 122 of circuits as shown in FIG. 1. The redundant rows 121-122 are marked with dots in FIG. 1 for easier identification. Each of the redundant rows 121 and 122 includes programmable logic circuit blocks, DSP circuits, and memory circuits in the respective columns 102, 104, and 106.

IC 100 includes four regions (quadrants) 110A, 110B, 110C, and 110D. The boundaries between the four regions 110A-110D are shown by thick lines in FIG. 1. Each of the regions 110A, 110B, 110C, and 110D includes one quarter of the programmable logic circuit blocks, DSP circuits, and memory circuits in IC 100. As an example, region 110A includes one-half of each of 12 rows of circuits and one-half of each of 27 columns of circuits.

Each of the regions 110A, 110B, 110C, and 110D includes one-half of a redundant row of circuits. Each of regions 110A and 110B includes half of redundant row 121, and each of regions 110C and 110D includes half of redundant row 122. Each half of each of the redundant rows 121-122 in each of regions 110A-110D is independently controllable to bypass a defect in a row of circuits within that region, as disclosed in further detail below with respect to FIG. 2.

According to some alternative embodiments, an integrated circuit may have three or more regions along a horizontal axis of the integrated circuit (e.g., the x direction in FIGS. 1-2), and/or the integrated circuit may have three or more regions along a vertical axis (e.g., the y direction in FIGS. 1-2) that is perpendicular to the horizontal axis. According to these alternative embodiments, the redundant rows in each of these additional regions is independently controllable relative to all of the other regions in the integrated circuit to bypass a defect in a row of circuits within that region, as disclosed with respect to FIG. 2.

Figure 2:
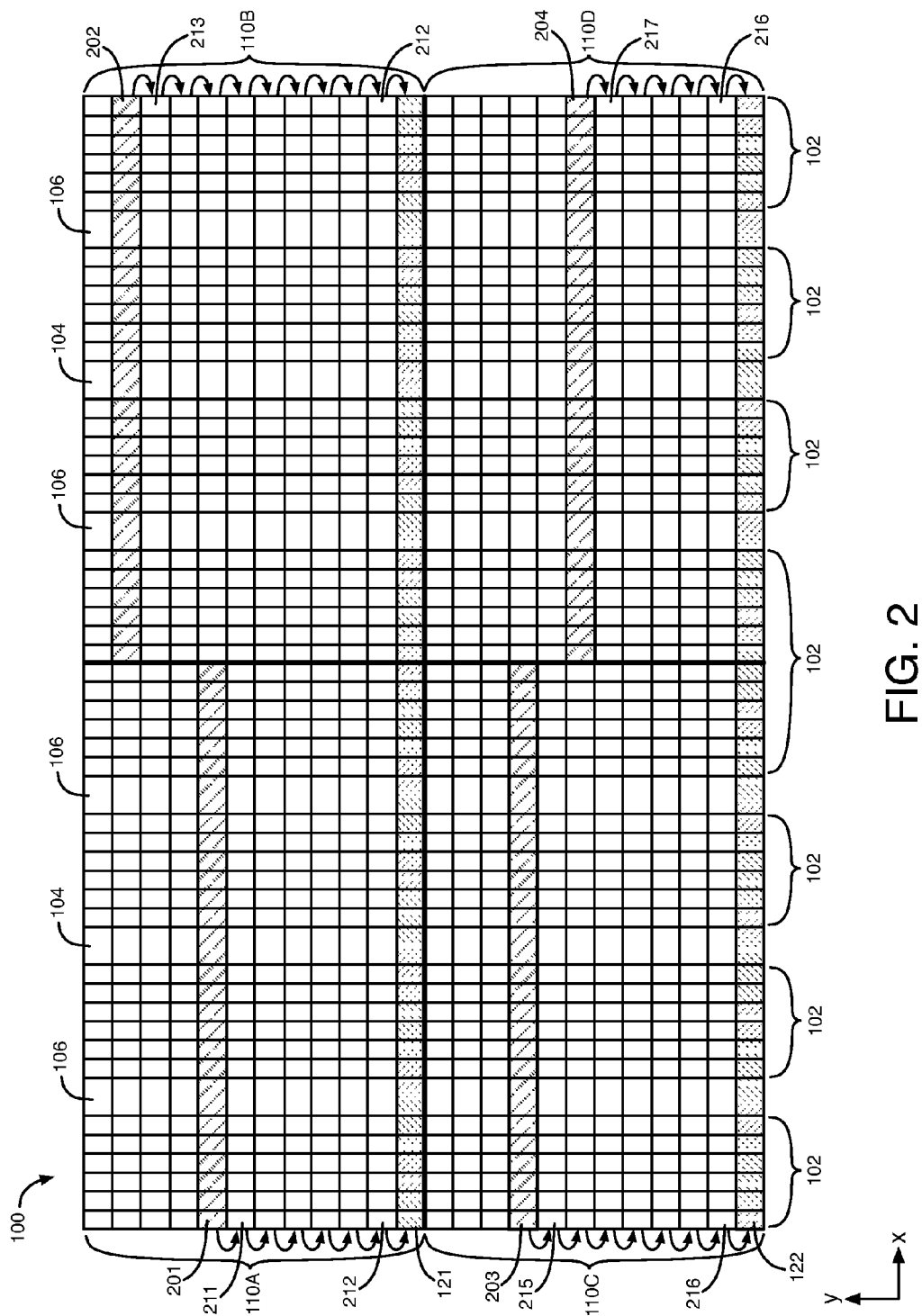
FIG. 2 illustrates further details of how each region in the integrated circuit (IC) of FIG. 1 is independently controllable to bypass a defect in a row of circuits within that region using a portion of a redundant row, according to an embodiment.

FIG. 2 illustrates further details of how each of the regions 110A-110D in integrated circuit (IC) 100 is independently controllable to bypass a defect in a row of circuits within that region using a portion of a redundant row, according to an embodiment. In the example of FIG. 2, a first defect exists in the left half of row 201 in region 110A, as illustrated in FIG. 2 by diagonal lines. A second defect exists in the right half of row 202 in region 110B, as illustrated in FIG. 2 by diagonal lines. In IC 100, the functions to be programmed into the rows of circuits in regions 110A and 110B can be shifted down independently of each other, as shown in FIG. 2, to bypass defects in different rows within the different regions 110A and 110B.

The left half of the row 201 in region 110A where the defect exists is disabled only within region 110A. The functions to be programmed for the left half of row 201 and each subsequent half row below row 201 in a user design for IC 100 are shifted down by one row within region 110A, as shown by the arrows next to region 110A in FIG. 2. For example, the functions to be programmed into the left half of row 201 in region 110A are shifted down by one row to the left half of row 211 in region 110A. Also, the functions to be programmed into the left half of row 212 in region 110A are shifted down by one row to the left half of redundant row 121 in region 110A. As such, the left half of redundant row 121 within region 110A is able to be programmed to implement the part of the user design originally intended for the left half of row 212.

The right half of the row 202 in region 110B where the defect exists is disabled only within region 110B. The functions to be programmed into the right half of row 202 and each subsequent half row below row 202 in a user design for IC 100 are shifted down by one row within region 110B, as shown by the arrows next to region 110B in FIG. 2. For example, the functions to be programmed into the right half of row 202 in region 110B are shifted down by one row to the right half of row 213 in region 110B. Also, the functions to be programmed into the right half of row 212 in region 110B are shifted down by one row to the right half of redundant row 121 in region 110B. As such, the right half of redundant row 121 within region 110B is able to be programmed to implement the part of the user design originally intended for the right half of row 212.

In the example shown in FIG. 2, the functions performed by 7 half rows are shifted down by one row each in region 110A, and the functions performed by 10 half rows are shifted down by one row each in region 110B. Thus, the number of half rows shifted down in region 110A may be different than the number of half rows shifted down in region 110B. The functions performed by 7 of the same rows are shifted down in both regions 110A-110B.

Also, in the example of FIG. 2, a third defect exists in the left half of row 203 in region 110C, as shown in FIG. 2 by diagonal lines. A fourth defect exists in the right half of row 204 in region 110D, as shown in FIG. 2 by diagonal lines. In IC 100, the functions to be programmed into different numbers of rows in regions 110C and 110D can be shifted down independently of each other, as shown in FIG. 2, to bypass defects in different rows within the different regions.

The left half of the row 203 in region 110C where the defect exists is disabled only within region 110C. The functions to be programmed into the left half of row 203 and each subsequent half row below row 203 in a user design for IC 100 are shifted down by one row within region 110C, as shown by the arrows next to region 110C in FIG. 2. For example, the functions to be programmed into the left half of row 203 in region 110C are shifted down by one row to the left half of row 215 in region 110C, and the functions to be programmed into the left half of row 216 in region 110C are shifted down by one row to the left half of redundant row 122 in region 110C. As such, the left half of redundant row 122 within region 110C is able to be programmed to implement the part of the user design originally intended for the left half of row 216.

The right half of the row 204 in region 110D where the defect exists is disabled only within region 110D. The functions to be programmed into the right half of row 204 and each subsequent half row below row 204 in a user design for IC 100 are shifted down by one row within region 110D, as shown by the arrows next to region 110D in FIG. 2. For example, the functions to be programmed into the right half of row 204 in region 110D are shifted down by one row to the right half of row 217 in region 110D. Also, the functions to be programmed into the right half of row 216 in region 110D are shifted down by one row to the right half of redundant row 122 in region 110D. As such, the right half of redundant row 122 within region 110D is able to be programmed to implement the part of the user design originally intended for the right half of row 216.

In the example shown in FIG. 2, the functions for 8 half rows are shifted down by one row each in region 110C, and the functions for 6 half rows are shifted down by one row each in region 110D. Thus, the number of half rows shifted down in region 110C may be different than the number of half rows shifted down in region 110D. The functions to be performed by 6 rows are shifted down in both regions 110C and 110D.

Figure 3:
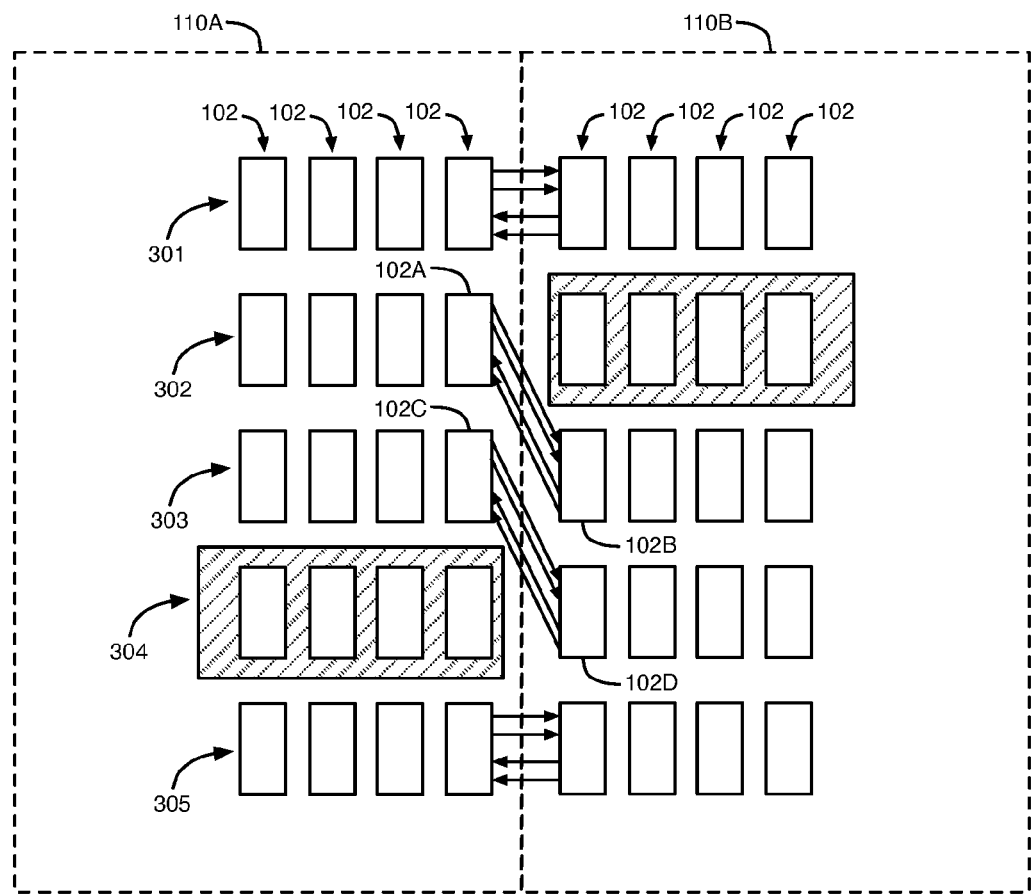
FIG. 3 illustrates an example of how multiplexer circuits in rows of circuits can be reconfigured to redirect signals that travel through the rows of circuits across the boundary of two regions having defects in different rows, according to an embodiment.

When the functions for different portions of rows of circuits in an integrated circuit are shifted independently, the horizontal routing wires do not line up at the rows that are no longer aligned. FIG. 3 illustrates an example of how multiplexer circuits in rows of circuits can be reconfigured to redirect signals that travel through the rows of circuits across the boundary of two regions having defects in different rows, according to an embodiment. FIG. 3 shows portions of five rows 301-305 of circuits in regions 110A and 110B as an example. FIG. 3 shows only 8 vertical columns 102 of programmable logic circuit blocks in the portions of the five rows of circuits 301-305 to simplify the drawing.

In the example of FIG. 3, a first defect exists in the left half of row 304 in region 110A as illustrated by diagonal lines, and a second defect exists in the right half of row 302 in region 110B, as illustrated by diagonal lines. The functions to be performed by row 302 in region 110B and each row below row 302 in region 110B are shifted down by one row each so that the defective portion of row 302 in region 110B does not perform any portion of a user design for IC 100. The functions performed by row 304 in region 110A and each row below row 304 in region 110A are also shifted down by one row each so that the defective portion of row 304 in region 110A does not perform any portion of a user design for IC 100.

Because the defect in region 110A is not in the same row as the defect in region 110B, an offset of one row is created across the boundary between regions 110A and 110B in rows 302-304 after the functions for the rows below the detective rows have been shifted down as discussed above. Because the functions for the rows below row 304 are shifted down by one row each in both of regions 110A and 110B, there is no offset across the boundary between regions 110A and 110B for row 305 or for any of the rows below row 305 in regions 110A and 110B.

FIG. 3 shows that the multiplexer circuits between regions 110A and 110B in rows 302-304 are reconfigured in order to compensate for the offset across the boundary between regions 110A and 110B in rows 302-304. For example, a first set of multiplexer circuits in IC 100 are configured to couple programmable logic circuit block 102A in row 302 in region 110A to programmable logic circuit block 102B in row 303 in region 110B across the boundary between regions 110A and 110B, as shown in FIG. 3 by the bidirectional diagonal arrows. As another example, a second set of multiplexer circuits in IC 100 are configured to couple programmable logic circuit block 102C in row 303 in region 110A to programmable logic circuit block 102D in row 304 in region 110B across the boundary between regions 110A and 110B, as shown in FIG. 3 by the bidirectional diagonal arrows.

Figure 4A:
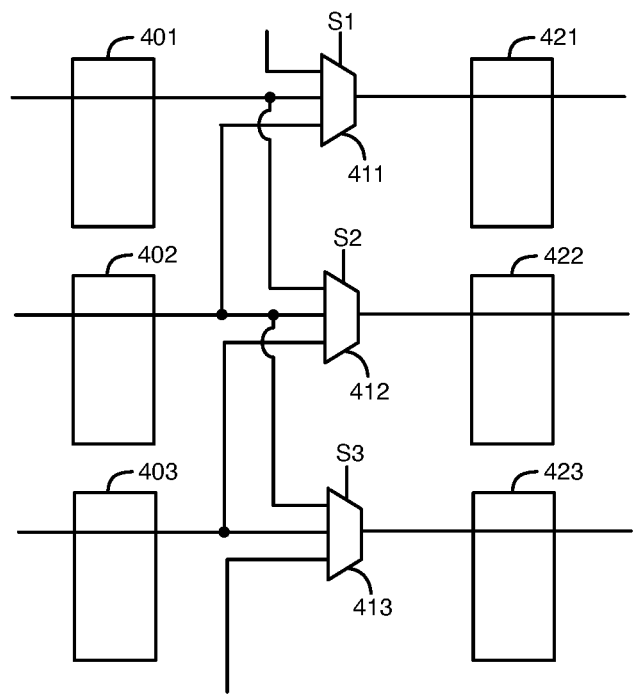
FIGS. 4A-4B illustrate examples of multiplexer circuits that provide programmable interconnections between portions of rows of circuits in an integrated circuit, according to some embodiments.
Figure 4B:
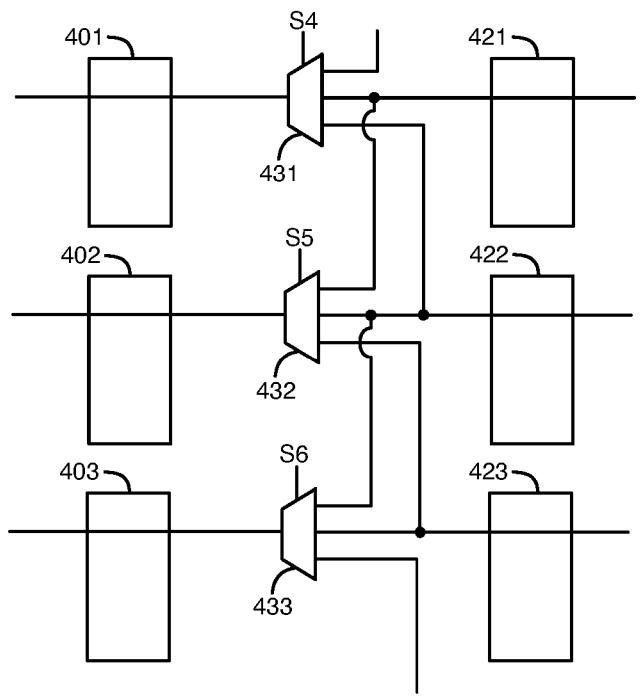

FIGS. 4A-4B show various examples of multiplexer circuits that can be configured to connect together different portions of rows of circuits across the boundary between two regions in an integrated circuit die. FIGS. 4A-4B illustrate examples of multiplexer circuits that provide programmable interconnections between portions of rows of circuits in an integrated circuit, according to some embodiments. FIGS. 4A-4B illustrate programmable logic circuit blocks (PLCBs) 401-403 and 421-423. FIG. 4A illustrates three right driving 3-to-1 multiplexer circuits 411-413. FIG. 4B illustrates three left driving 3-to-1 multiplexer circuits 431-433. PLCBs 401 and 421 and multiplexer circuits 411 and 431 are in a first row of circuits in the IC. PLCBs 402 and 422 and multiplexer circuits 412 and 432 are in a second row of circuits in the IC. PLCBs 403 and 423 and multiplexer circuits 413 and 433 are in a third row of circuits in the IC.

The programmable interconnection circuits of FIGS. 4A-4B include multiplexer circuits 411-413 and 431-433 and the routing wires connected thereto. Multiplexer circuits 411, 412, and 413 are configured to provide signals in a first direction from left to right in FIG. 4A (i.e., right driving) from a first region of the IC (e.g., region 110A or 110C) to a second region of the IC (e.g., region 110B or 110D) that is to the right of the first region in the IC. Each of the multiplexer circuits 411-413 can be configured to provide a signal from one of three adjacent rows in the first region of the IC to one row in the second region of the IC. Multiplexer circuit 411 is configured in response to select signals S1 to provide a signal from PLCB 401, PLCB 402, or a PLCB in the row directly above the row containing PLCB 401 to PLCB 421 and/or other circuits in the same row. Multiplexer circuit 412 is configured in response to select signals S2 to provide a signal from PLCB 401, PLCB 402, or PLCB 403 to PLCB 422 and/or other circuits in the same row. Multiplexer circuit 413 is configured in response to select signals S3 to provide a signal from PLCB 402, PLCB 403, or a PLCB in the row directly below the row containing PLCB 403 to PLCB 423 and/or other circuits in the same row.

Multiplexer circuits 431-433 of FIG. 4B are configured to provide signals in a second direction from right to left in FIG. 4B (i.e., left driving) that is opposite to the first direction from the second region of the IC (e.g., region 110B or 110D) to the first region of the IC (e.g., region 110A or 110C). Each of the multiplexer circuits 431-433 can be configured to provide a signal from one of three adjacent rows in the second region of the IC to one row in the first region of the IC. Multiplexer circuit 431 is configured in response to select signals S4 to provide a signal from PLCB 421, PLCB 422, or a PLCB in the row directly above the row containing PLCB 421 to PLCB 401 and/or other circuits in the same row. Multiplexer circuit 432 is configured in response to select signals S5 to provide a signal from PLCB 421, PLCB 422, or PLCB 423 to PLCB 402 and/or other circuits in the same row. Multiplexer circuit 433 is configured in response to select signals S6 to provide a signal from PLCB 422, PLCB 423, or a PLCB in the row directly below the row containing PLCB 423 to PLCB 403 and/or other circuits in the same row.

Because each of multiplexer circuits 411-413 and 431-433 can transmit a signal from one of 3 adjacent rows across the boundary between two regions of the IC, multiplexer circuits 411-413 and 431-433 can be configured to connect together different rows of circuits across the boundary between the two regions. For this reason, multiplexer circuits 411-413 and 431-433 can accommodate shifting the programmed functions for portions of one or more rows in one region when the programmed functions are not shifted in the other portions of the same rows in the horizontally adjacent region.

Figure 5:
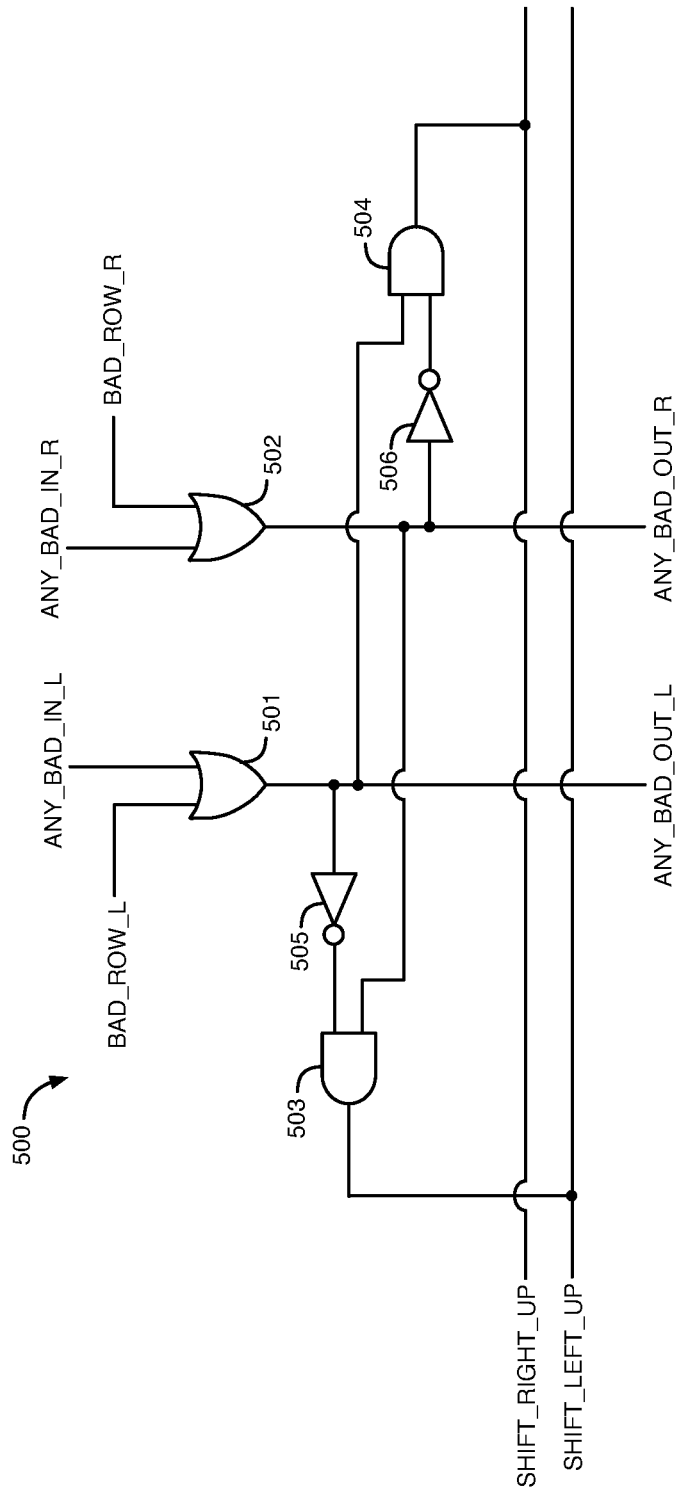
FIG. 5 illustrates an example of a control circuit that generates select signals for controlling the multiplexer circuits that connect together different rows of circuits across the boundary between two regions of an integrated circuit, according to an embodiment.

FIG. 5 illustrates an example of a control circuit that can generate select signals for controlling the multiplexer circuits that connect together different rows of circuits across the boundary between two regions of an integrated circuit, according to an embodiment. The control circuit 500 of FIG. 5 includes OR logic gate circuits 501-502, AND logic gate circuits 503-504, and inverter circuits 505-506. OR gate circuit 501 generates signal ANY_BAD_OUT_L at its output by performing an OR Boolean function on input signals ANY_BAD_IN_L and BAD_ROW_L that are provided to inputs of OR gate 501. OR gate 502 generates signal ANY_BAD_OUT_R at its output by performing an OR Boolean function on input signals ANY_BAD_IN_R and BAD_ROW_R that are provided to inputs of OR gate 502.

The signal BAD_ROW_L for any half row in one of the left side regions 110A or 110C is asserted to a logic high state when a defect is detected in that half row. A different signal BAD_ROW_R is generated for each half row of circuits in the IC 100 within each of regions 110B and 110D. The signal BAD_ROW_R for any half row in one of the right side regions 110B or 110D is asserted to a logic high state when a defect is detected in that half row. The signals BAD_ROW_L and BAD_ROW_R may be provided by non-volatile memory and logic circuits that are configured during testing of the IC.

Each row of circuits in IC 100 includes a control circuit 500. For example, regions 110A and 110C in IC 100 each have 12 rows of circuits, and therefore, regions 110A and 110C each have 12 control circuits 500. The input signals ANY_BAD_IN_L and ANY_BAD_IN_R to each control circuit 500 are the output signals ANY_BAD_OUT_L and ANY_BAD_OUT_R, respectively, of the control circuit 500 that is directly above it. However, the first control circuit 500 for an adjacent pair of regions does not have a control circuit 500 above it, and therefore, that control circuit 500 may have input signals ANY_BAD_IN_L and ANY_BAD_IN_R connected to a logic 0.

The operation of control circuit 500 of FIG. 5 is now described. If a defect is detected in the left half of the row containing circuit 500 (referred to herein as row A) in the left side region 110A or 110C, then BAD_ROW_L is asserted high, causing the output signal ANY_BAD_OUT_L of OR gate 501 to be high and the output signal of inverter 505 to be low. The output signal of OR gate 501 is also high if the ANY_BAD_IN_L signal is high indicating a defect in the left side region above row A. If no defect is detected in the right half of row A in the right side region 110B or 110D, then BAD_ROW_R is low. If there is no defect in the right side region above row A, then ANY_BAD_IN_R is also low. If ANY_BAD_IN_R and BAD_ROW_R are both low, then the output signal ANY_BAD_OUT_R of OR gate 502 is low, and the output signal of inverter circuit 506 is high. In response to the output signals of OR gate 501 and inverter 506 both being high, the output signal SHIFT_RIGHT_UP of AND gate 504 is high.

Signal SHIFT_RIGHT_UP is provided as a first select signal to the select inputs of a multiplexer circuit in row A driving right and a multiplexer circuit in row A driving left. For example, signal SHIFT_RIGHT_UP may be provided to select inputs of multiplexer circuits 411 and 431 as signals S1 and S4, respectively, or to select inputs of multiplexer circuits 412 and 432 as signals S2 and S5, respectively. In response to signal SHIFT_RIGHT_UP being high, these multiplexer circuits provide signals between regions 110A and 110B (or between regions 110C and 110D). If for example multiplexer circuits 412 and 432 are in row A, multiplexer circuit 412 drives a signal from PLCB 403 to the right half of row A, and multiplexer circuit 432 drives a signal from PLCB 421 to the left half of row A.

If a defect is detected in the right half of row A containing circuit 500 in the right side region 110B or 110D, then BAD_ROW_R is asserted high, causing the output signal ANY_BAD_OUT_R of OR gate 502 to be high and the output signal of inverter 506 to be low. The output signal of OR gate 502 is also high if the ANY_BAD_IN_R signal is high indicating a defect in the right side region above row A. If no defect is detected in the left half of row A in the left side region 110A or 110C, then BAD_ROW_L is low. If there is no defect detected in the left side region above row A, then ANY_BAD_IN_L is low. If ANY_BAD_IN_L and BAD_ROW_L are both low, then the output signal of OR gate 501 is low, and the output signal of inverter circuit 505 is high. In response to the output signals of OR gate 502 and inverter 505 both being high, the output signal SHIFT_LEFT_UP of AND gate 503 is high.

Signal SHIFT_LEFT_UP is provided as a second select signal to the select inputs of a multiplexer circuit in row A driving left and a multiplexer circuit in row A driving right. For example, signal SHIFT_LEFT_UP may be provided to select inputs of multiplexer circuits 412 and 432 as signals S2 and S5, respectively, or to select inputs of multiplexer circuits 413 and 433 as signals S3 and S6, respectively. In response to signal SHIFT_LEFT_UP being high, these multiplexer circuits provide signals between regions 110A and 110B (or between regions 110C and 110D). If for example multiplexer circuits 412 and 432 are in row A, multiplexer circuit 412 drives a signal from PLCB 401 to row A, and multiplexer circuit 432 drives a signal from PLCB 423 to row A.

Both of signals SHIFT_LEFT_UP and SHIFT_RIGHT_UP generated by one control circuit 500 are low if row A and the rows above row A do not contain any defects in either of the left or right regions. Both of signals SHIFT_LEFT_UP and SHIFT_RIGHT_UP generated by one control circuit 500 are also low if there are defects in both the left and right regions in row A or in rows above row A. If both of signals SHIFT_LEFT_UP and SHIFT_RIGHT_UP from one control circuit 500 are low, then the right driving and left driving multiplexer circuits receiving these select signals drive signals between the same rows. For example, multiplexer circuit 411 may drive a signal from PLCB 401 to PLCB 421, and multiplexer circuit 431 may drive a signal from PLCB 421 to PLCB 401, in response to the select signals provided to multiplexer circuits 411 and 431 both being low.

Figure 6:
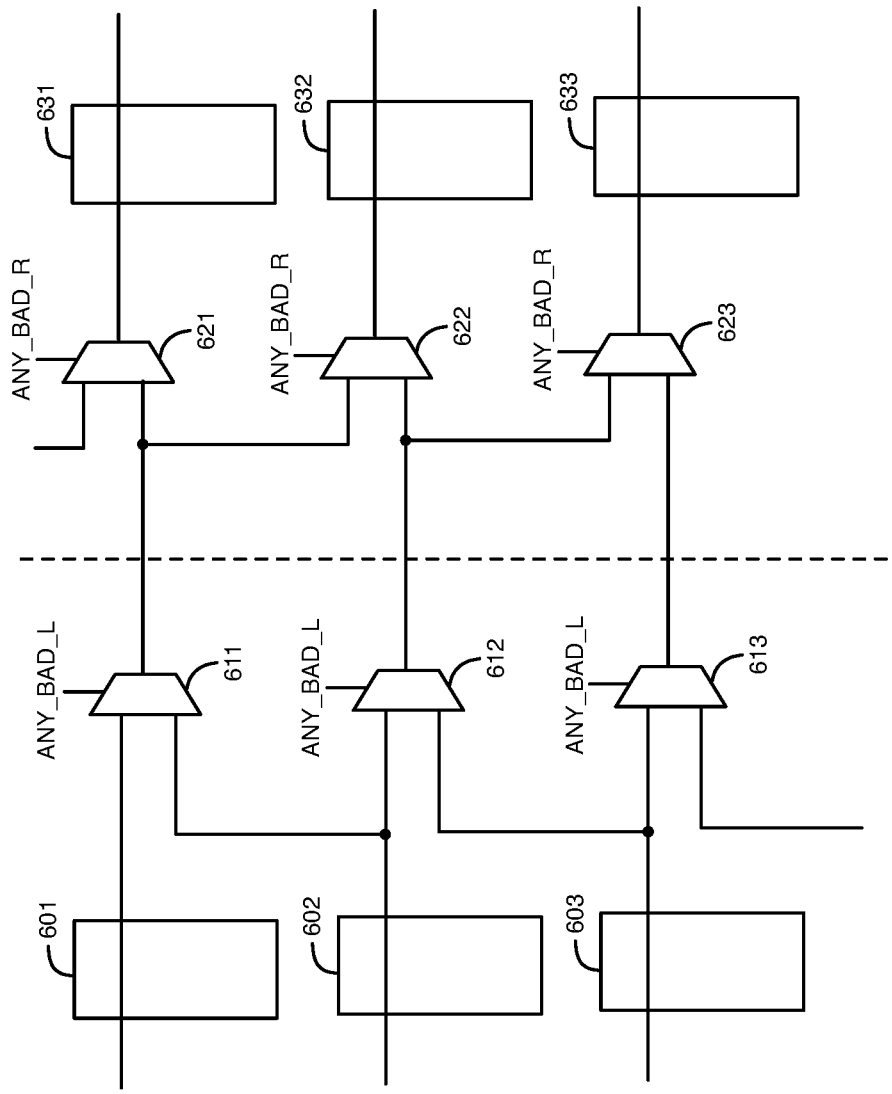
FIG. 6 illustrates examples of two 2-to-1 multiplexer circuits in each row of circuits at the boundary between two regions in an integrated circuit, according to an embodiment.

FIG. 6 illustrates examples of two 2-to-1 multiplexer circuits in each row of circuits at the boundary between two regions in an integrated circuit die, according to an embodiment. FIG. 6 illustrates programmable logic circuit blocks (PLCBs) 601-603 and 631-633 and right driving 2-to-1 multiplexer circuits 611-613 and 621-623. PLCBs 601-603, multiplexer circuits 611-613 and 621-623, and PLCBs 631-633 are in first, second, and third rows of circuits, respectively, in an IC.

Multiplexer circuits 611-613 and 621-623 are configured to provide signals from left to right in FIG. 6 (i.e., right driving) from a first region of the IC (e.g., region 110A or 110C) to a second region of the IC (e.g., region 110B or 110D) that is to the right of the first region in the IC. The multiplexer circuits of FIG. 6 can drive a signal from any of the rows of circuits in the first region of the IC to one of three adjacent rows in the second region of the IC across the boundary between the first and second regions. The boundary between the first and second regions of the IC is shown as a vertical dotted line in FIG. 6. Multiplexer circuits 611-613 and 621-623 can accommodate shifting the programmed functions for portion(s) of one or more rows in one region when the programmed functions are not shifted in the other portions of the same rows in the horizontally adjacent region.

A select signal ANY_BAD_L is provided to the select input of each of multiplexer circuits 611-613. The select signal ANY_BAD_L is generated by one of the control circuits 500 as the output signal ANY_BAD_OUT_L of that control circuit 500. Select signal ANY_BAD_L may be provided as an input signal ANY_BAD_IN_L to one or more other control circuits 500.

A select signal ANY_BAD_R is provided to the select input of each of multiplexer circuits 621-623. The select signal ANY_BAD_R is generated by one of the control circuits 500 as the output signal ANY_BAD_OUT_R of that control circuit 500. Select signal ANY_BAD_R may be provided as an input signal ANY_BAD_IN_R to one or more other control circuits 500.

Multiplexer circuit 611 is configured in response to a select signal ANY_BAD_L to provide a signal from PLCB 601 or PLCB 602 in two different rows to an input of multiplexer circuit 621. Multiplexer circuit 621 is configured in response to a select signal ANY_BAD_R to provide the output signal of multiplexer circuit 611 or a signal from a third row (not shown) to PLCB 631 and/or other circuits in the same row. Thus, multiplexer circuits 611 and 621 can provide a signal from one of three different rows in the first region to the row containing PLCB 631 in the second region.

Multiplexer circuit 612 is configured in response to a select signal ANY_BAD_L to provide a signal from PLCB 602 or PLCB 603 in two different rows to an input of multiplexer circuit 622. Multiplexer circuit 622 is configured in response to a select signal ANY_BAD_R to provide the output signal of multiplexer circuit 611 or the output signal of multiplexer circuit 612 to PLCB 632 and/or other circuits in the same row. Thus, multiplexer circuits 612 and 622 can provide a signal from one of three different rows in the first region to the row containing PLCB 632 in the second region.

Multiplexer circuit 613 is configured in response to a select signal ANY_BAD_L to provide a signal from PLCB 603 in one row or from a PLCB in another row (not shown) to an input of multiplexer circuit 623. Multiplexer circuit 623 is configured in response to a select signal ANY_BAD_R to provide the output signal of multiplexer circuit 612 or the output signal of multiplexer circuit 613 to PLCB 633 and/or other circuits in the same row. Thus, multiplexer circuits 613 and 623 can provide a signal from one of three different rows in the first region to the row containing PLCB 633 in the second region.

Multiplexer circuits 611-613 and 621-623 can transmit signals across the boundary between the first and second regions to the appropriate rows in a user design for the IC when functions for some of the rows in one of the first or second regions have been shifted down and functions for the same rows in the other region have not been shifted, as discussed above. Although only right driving multiplexer circuits 611-613 and 621-623 are shown in FIG. 6, the IC also includes left driving 2-to-1 multiplexer circuits (not shown) that drive signals from the second region to the first region of the IC across the boundary between these two regions.

Figure 7:
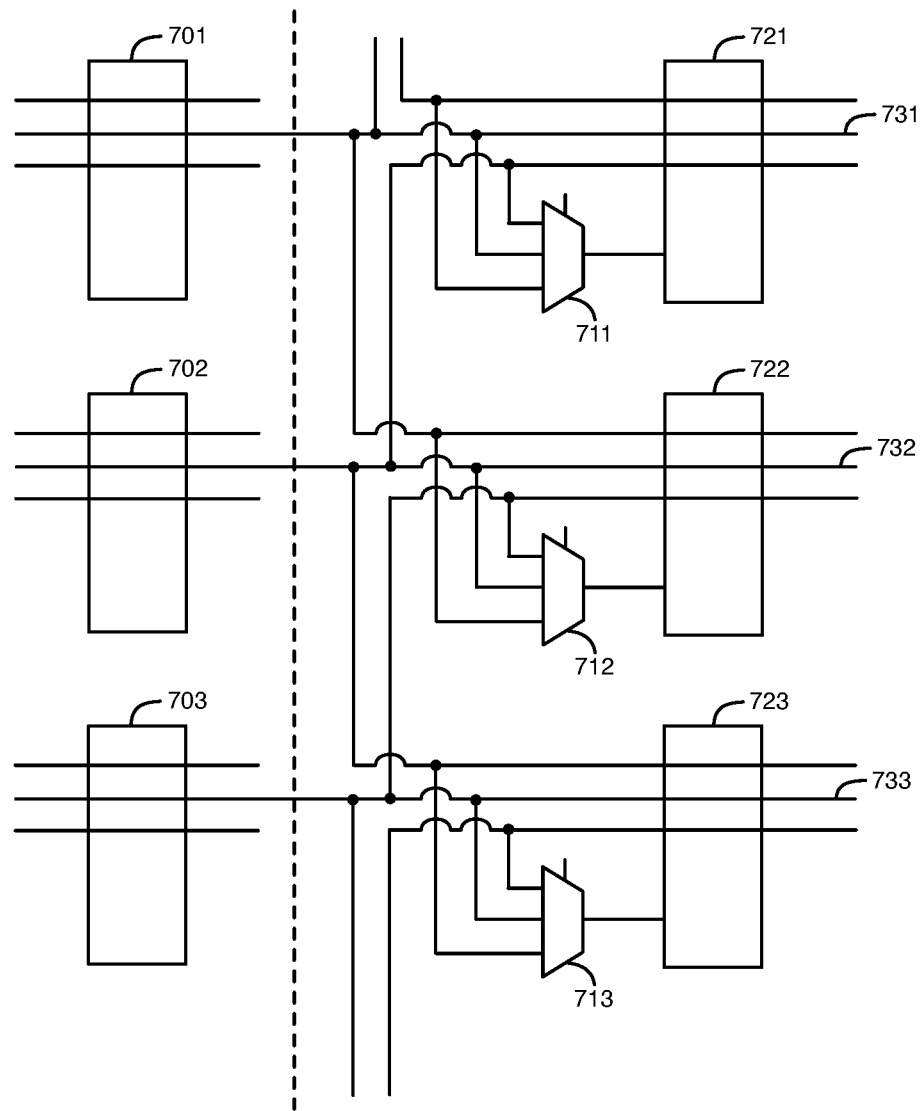
FIG. 7 illustrates a 3-to-1 multiplexer circuit in each row of circuits at the boundary between two regions in an integrated circuit, according to an embodiment.
Figure 8:
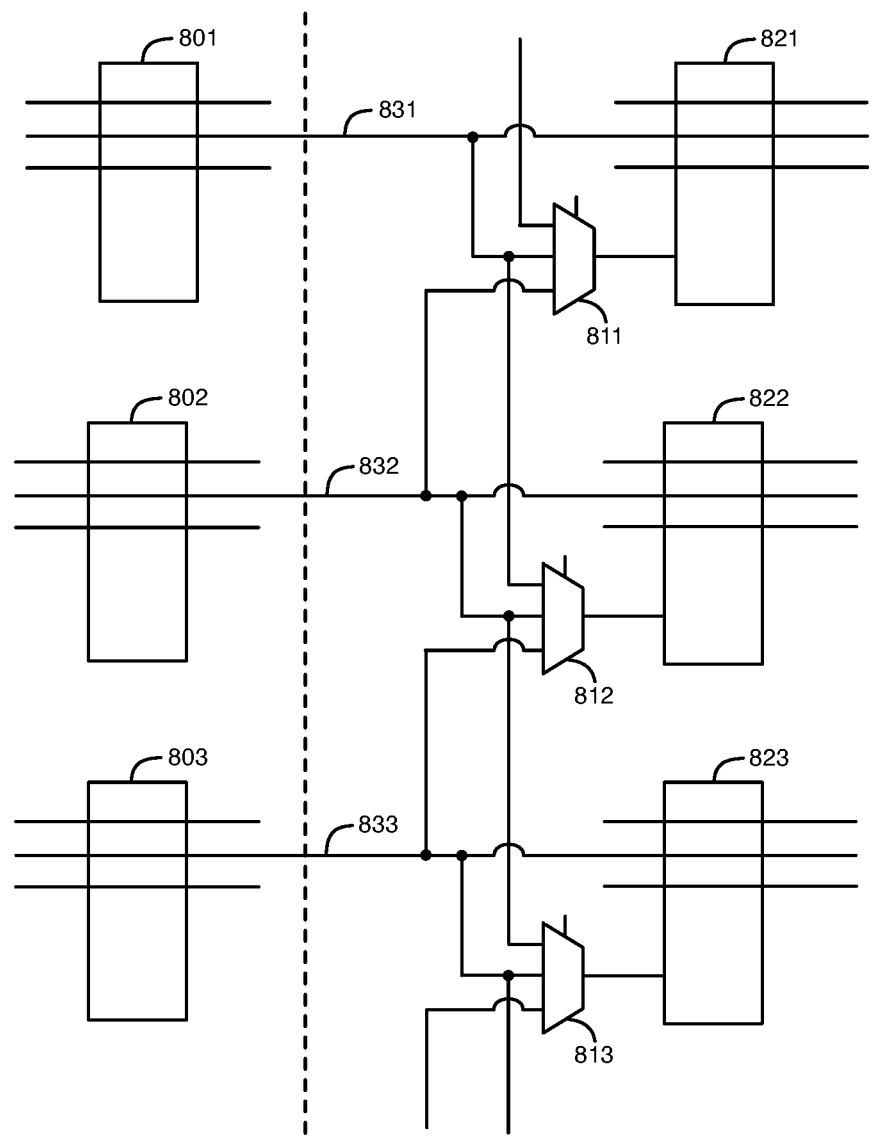
FIG. 8 illustrates 3-to-1 multiplexer circuits each having inputs coupled to three adjacent rows of circuits at the boundary between two regions in an integrated circuit, according to an embodiment.

According to other embodiments, existing routing multiplexer circuits that are part of a programmable interconnect structure in a programmable logic integrated circuit are repurposed to function as shifting multiplexer circuits to avoid adding additional multiplexer circuits. However, in some of these embodiments, the number of wires that cross the boundaries between regions may be reduced. FIGS. 7-8 illustrate examples of these embodiments.

FIG. 7 illustrates a 3-to-1 multiplexer circuit in each row of circuits at the boundary between two regions in an integrated circuit die, according to an embodiment. FIG. 7 shows programmable logic circuit blocks (PLCBs) 701-703 and 721-723 and right driving 3-to-1 multiplexer circuits 711-713. PLCBs 701-703, multiplexer circuits 711-713, and PLCBs 721-723 are in first, second, and third rows of circuits, respectively, in an integrated circuit (IC).

In the embodiment of FIG. 7, in a set of three horizontal routing wires in each row of circuits, two of the wires end at the boundary between the first and second regions, and one of the wires continues across the boundary between the first and second regions. The boundary between the first and second regions is shown by a vertical dotted line in FIG. 7. The wires that continue across the boundary between the first and second regions in the first, second, and third rows of circuits in FIG. 7 are wires 731, 732, and 733, respectively.

Multiplexer circuits 711-713 may be repurposed routing multiplexers such as, for example, driver input multiplexers (DIMs) or logic array block input multiplexers (LIMs). Each of the multiplexer circuits 711-713 uses three fanin wires to select signals between the same row, the adjacent row above the same row, or the adjacent row below the same row. Thus, multiplexer circuit 711 is configured in response to select signals to provide a signal from the row containing PLCB 701, the row containing PLCB 702, or the row above the row containing PLCB 701 to an input of PLCB 721. Multiplexer circuit 712 is configured in response to select signals to provide a signal from the row containing PLCB 701, the row containing PLCB 702, or the row containing PLCB 703 to an input of PLCB 722. Multiplexer circuit 713 is configured in response to select signals to provide a signal from the row containing PLCB 702, the row containing PLCB 703, or the row below the row containing PLCB 703 to an input of PLCB 723.

The select inputs of multiplexer circuits 711-713 may, for example, be controlled by configuration bits that are stored in configuration random access memory (CRAM). The configuration bits function as select signals that control multiplexer circuits 711-713. In this example, the values of the bits stored in CRAM are modified by the programming hardware to select the appropriate fanin for the multiplexer circuits 711-713 based on which rows of circuits are shifted across the boundary between the first and second regions. The triplication of the wires at the inputs of multiplexer circuits 711-713 is implemented by using three wires at the inputs of each of the multiplexer circuits 711-713 that span each of the rows in the second region. Thus, the 3 inputs of each of the multiplexer circuits 711-713 are coupled to 3 wires that span the corresponding row in the second region.

In another embodiment, wires extend the input range of the multiplexer circuits to span three adjacent rows of circuits. The wires at the inputs of each multiplexer circuit do not span across the same row of circuits. An example of this embodiment is shown in FIG. 8. FIG. 8 illustrates 3-to-1 multiplexer circuits each having inputs coupled to three adjacent rows of circuits, according to an embodiment. FIG. 8 shows programmable logic circuit blocks (PLCBs) 801-803 and 821-823 and right driving 3-to-1 multiplexer circuits 811-813. PLCBs 801-803, multiplexer circuits 811-813, and PLCBs 821-823 are in first, second, and third rows of circuits, respectively, in an integrated circuit (IC).

In the embodiment of FIG. 8, in a set of three horizontal routing wires in each row of circuits, two of the wires end at the boundary between the first and second regions, and one of the wires continues across the boundary between the first and second regions, as with the embodiment of FIG. 7. The boundary between the first and second regions is shown by a vertical dotted line in FIG. 8. The wires that continue across the boundary between the first and second regions in the first, second, and third rows of circuits in FIG. 8 are wires 831, 832, and 833, respectively.

Multiplexer circuits 811-813 may be repurposed routing multiplexers such as, for example, DIMs or LIMs. Each of the multiplexer circuits 811-813 uses three fanin wires to select signals between the same row, the adjacent row above the same row, or the adjacent row below the same row. Thus, multiplexer circuit 811 is configured in response to select signals to provide a signal from the row containing PLCB 801, the row containing PLCB 802, or the row above the row containing PLCB 801 to an input of PLCB 821. Multiplexer circuit 812 is configured in response to select signals to provide a signal from the row containing PLCB 801, the row containing PLCB 802, or the row containing PLCB 803 to an input of PLCB 822. Multiplexer circuit 813 is configured in response to select signals to provide a signal from the row containing PLCB 802, the row containing PLCB 803, or the row below the row containing PLCB 803 to an input of PLCB 823.

The select inputs of multiplexer circuits 811-813 may, for example, be controlled by configuration bits stored in CRAM that function as select signals for controlling multiplexer circuits 811-813. In this example, the values of the bits stored in CRAM are modified by the programming hardware to select the appropriate fanin for the multiplexer circuits 811-813 based on which rows of circuits are shifted across the boundary between the first and second regions. Alternatively, the multiplexer circuits 811-813 may use a combination of both configuration RAM bits and shifting signals, such as SHIFT_RIGHT_UP, to select the appropriate fanin.

Figure 9:
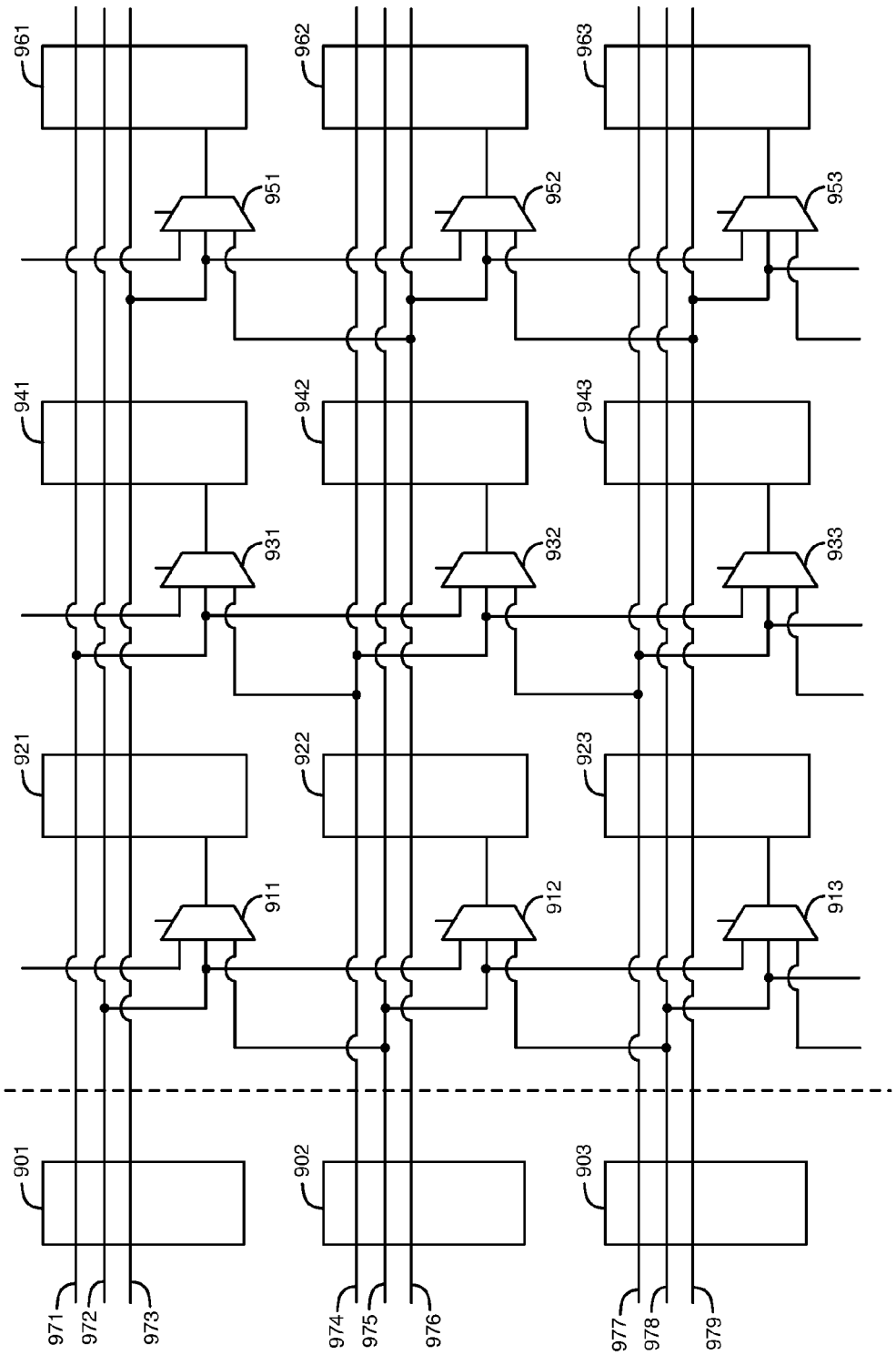
FIG. 9 illustrates an example of a circuit architecture that allows three routing wires to cross the boundary between two regions in an integrated circuit, according to an embodiment.

FIG. 9 illustrates an example of a circuit architecture that allows all three of the routing wires in a row of circuits to cross the boundary between the first and second regions, according to an embodiment. In FIG. 9, fanin inputs on the routing multiplexer circuits are provided to wires from non-shifted and shifted rows of circuits. Multiplexer circuits are used in each row of circuits at the boundary between the first and second regions to provide a connection to each wire that crosses the boundary. Each column of the multiplexer circuits in FIG. 9 provides fanins to different wires. The embodiment of FIG. 9 reduces the logical connectivity of the routing for the wires that cross the boundary, but the total number of wires that cross the boundary is unaffected by redundancy or shifting of the rows.

FIG. 9 shows programmable logic circuit blocks (PLCBs) 901-903, 921-923, 941-943, and 961-963. FIG. 9 also shows right driving 3-to-1 multiplexer circuits 911-913, 931-933, and 951-953. PLCBs 901-903, multiplexer circuits 911-913, PLCBs 921-923, multiplexer circuits 931-933, PLCBs 941-943, multiplexer circuits 951-953, and PLCBs 961-963 are in first, second, and third rows of circuits, respectively, in an integrated circuit (IC).

Multiplexer circuits 911-913, 931-933, and 951-953 may be repurposed routing multiplexers such as, for example, DIMs or LIMs. Each of the multiplexer circuits 911-913, 931-933, and 951-953 uses three fanin wires to select signals between the same row, the adjacent row above the same row, or the adjacent row below the same row. Multiplexer circuit 911 is configured in response to select signals to provide a signal from wire 972 in the row containing PLCB 901, wire 975 in the row containing PLCB 902, or a wire in the row above the row containing PLCB 901 to an input of PLCB 921. Multiplexer circuit 912 is configured in response to select signals to provide a signal from wire 972, wire 975, or wire 978 in the row containing PLCB 903 to an input of PLCB 922. Multiplexer circuit 913 is configured in response to select signals to provide a signal from wire 975, wire 978, or a wire in the row below the row containing PLCB 903 to an input of PLCB 923.

Multiplexer circuit 931 is configured in response to select signals to provide a signal from wire 971 in the row containing PLCB 921, wire 974 in the row containing PLCB 922, or a wire in the row above the row containing PLCB 921 to an input of PLCB 941. Multiplexer circuit 932 is configured in response to select signals to provide a signal from wire 971, wire 974, or wire 977 in the row containing PLCB 923 to an input of PLCB 942. Multiplexer circuit 933 is configured in response to select signals to provide a signal from wire 974, wire 977, or a wire in the row below the row containing PLCB 923 to an input of PLCB 943.

Multiplexer circuit 951 is configured in response to select signals to provide a signal from wire 973 in the row containing PLCB 941, wire 976 in the row containing PLCB 942, or a wire in the row above the row containing PLCB 941 to an input of PLCB 961. Multiplexer circuit 952 is configured in response to select signals to provide a signal from wire 973, wire 976, or wire 979 in the row containing PLCB 943 to an input of PLCB 962. Multiplexer circuit 953 is configured in response to select signals to provide a signal from wire 976, wire 979, or a wire in the row below the row containing PLCB 943 to an input of PLCB 963.

Thus, in the embodiment of FIG. 9, each of the multiplexer circuits 911-913, 931-933, and 951-953 has input connections to wires that cross the boundary between the first and second regions in three adjacent rows of circuits. The multiplexer circuits of FIG. 9 can be configured to provide signals from three different wires in a row of circuits to inputs of PLCBs in one of the rows. For example, multiplexer circuits 912, 932, and 952 can be configured to provide signals on wires 972, 971, and 973 in the first row to inputs of PLCBs 922, 942, and 962, respectively. As another example, multiplexer circuits 912, 932, and 952 can be configured to provide signals on wires 975, 974, and 976 in the second row to inputs of PLCBs 922, 942, and 962, respectively. As yet another example, multiplexer circuits 912, 932, and 952 can be configured to provide signals on wires 978, 977, and 979 in the third row to inputs of PLCBs 922, 942, and 962, respectively.

The select inputs of the multiplexer circuits in FIG. 9 may, for example, be controlled by configuration bits stored in CRAM that function as select signals for controlling the multiplexer circuits. In this example, the values of the bits stored in CRAM are modified by the programming hardware to select the appropriate fanin for the multiplexer circuits based on which rows of circuits are shifted across the boundary between the first and second regions. Although only right driving multiplexer circuits are shown in FIGS. 7-9, each IC also includes left driving 3-to-1 multiplexer circuits that drive signals from the second region to the first region of the IC across the boundary between these two regions.

Figure 10:
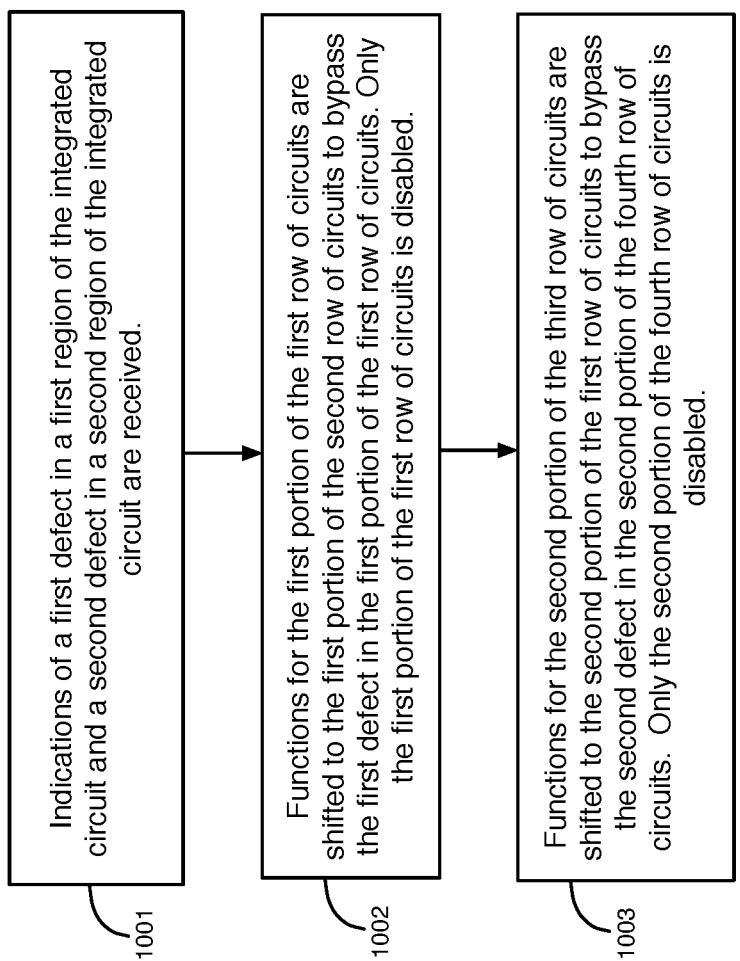
FIG. 10 illustrates examples of operations for bypassing defects in an integrated circuit, according to an embodiment.

FIG. 10 illustrates examples of operations for bypassing defects in an integrated circuit, according to an embodiment. In operation 1001, indications of a first defect in a first region of the integrated circuit and a second defect in a second region of the integrated circuit are received. These indications may be provided, for example, in signals ANY_BAD_IN_R, ANY_BAD_IN_L, BAD_ROW_L, and/or BAD_ROW_R shown in FIG. 5. The first region includes a first portion of each of first, second, third, and fourth rows of circuits. The second region includes a second portion of each of the first, the second, the third, and the fourth rows of circuits. In operation 1002, functions for the first portion of the first row of circuits are shifted to the first portion of the second row of circuits to bypass the first defect in the first portion of the first row of circuits. Only the first portion of the first row of circuits is disabled. In operation 1003, functions for the second portion of the third row of circuits are shifted to the second portion of the first row of circuits to bypass the second defect in the second portion of the fourth row of circuits. Only the second portion of the fourth row of circuits is disabled.

The methods and apparatuses described herein may be incorporated into any suitable electronic device or system of electronic devices. For example, the methods and apparatuses may be incorporated into numerous types of devices, such as programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), microprocessors, and graphics processing units (GPUs).

The integrated circuits described herein may be part of a data processing system that includes one or more of the following components; a processor; memory; input/output circuitry; and peripheral devices. The integrated circuits can be used in a wide variety of applications, such as computer networking, data networking, instrumentation, video processing, digital signal processing, or any suitable other application.

Although the method operations were described in a specific order, it should be understood that other operations may be performed in between described operations, described operations may be adjusted so that they occur at slightly different times or in a different order, or described operations may be distributed in a system that allows the occurrence of the operations at various intervals associated with the processing.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An integrated circuit comprising:
   rows of circuits, wherein a first region of the integrated circuit comprises a first portion of each of the rows of circuits, wherein a second region of the integrated circuit comprises a second portion of each of the rows of circuits,
   wherein the integrated circuit shifts functions for a first subset of the rows of circuits to a second subset of the rows of circuits in the first region based on a first defect in a first one of the rows of circuits in the first region, wherein the first one of the rows of circuits is disabled only in the first region,
   wherein the integrated circuit shifts functions for a third subset of the rows of circuits to a fourth subset of the rows of circuits in the second region based on a second defect in a second one of the rows of circuits in the second region, wherein the second one of the rows of circuits is disabled only in the second region, wherein the second one of the rows of circuits is different than the first one of the rows of circuits, and wherein the third subset of the rows of circuits comprises at least some of the rows of circuits in the first subset.

2. The integrated circuit of claim 1 further comprising:
   multiplexer circuits, wherein a third one of the rows of circuits is a redundant row of circuits, and wherein the multiplexer circuits shift functions for the first and second portions of a fourth one of the rows of circuits to the redundant row of circuits in both of the first and second regions of the integrated circuit.

3. The integrated circuit of claim 1 further comprising:
   multiplexer circuits, wherein the multiplexer circuits are configured to provide a signal from the first portion of a third one of the rows of circuits to the second portion of a fourth one of the rows of circuits, and wherein the fourth one of the rows of circuits is a different one of the rows of circuits than the third one of the rows of circuits.

4. The integrated circuit of claim 1 further comprising:
   multiplexer circuits; and
   a control circuit that generates control signals for controlling the multiplexer circuits, wherein the control circuit is responsive to a first input signal indicating if the first portion of the first one of the rows of circuits contains the first defect, and wherein the control circuit is responsive to a second input signal indicating if the second portion of the first one of the rows of circuits contains a defect.

5. The integrated circuit of claim 4, wherein the control circuit causes the multiplexer circuits to provide signals across a boundary between the first and second regions between the first portion of a third one of the rows of circuits to the second portion of a fourth one of the rows of circuits to cause functions for a single one of the rows of circuits in a user design for the integrated circuit to be performed by the first portion of the third one of the rows of circuits and the second portion of the fourth one of the rows of circuits, and wherein the third and fourth ones of the rows of circuits are different rows of circuits.

6. The integrated circuit of claim 1 further comprising:
multiplexer circuits, wherein one of the multiplexer circuits in each of the rows of circuits is configurable to provide signals across a boundary between the first and second regions from any one of three wires in three adjacent ones of the rows of circuits to a circuit block in the one of the rows of circuits containing that multiplexer circuit.

7. The integrated circuit of claim 1 further comprising:
multiplexer circuits, wherein two of the multiplexer circuits in each of the rows of circuits are configurable to provide signals across a boundary between the first and second regions from any one of three wires in three adjacent ones of the rows of circuits to a circuit block in one of the rows of circuits.

8. The integrated circuit of claim 1, wherein the integrated circuit is a programmable logic integrated circuit, and each of the rows of circuits comprises programmable logic circuit blocks.

9. A programmable logic integrated circuit comprising:
rows of circuits comprising programmable logic circuits, wherein a first region of the programmable logic integrated circuit comprises a first portion of each of the rows of circuits, wherein a second region of the programmable logic integrated circuit comprises a second portion of each of the rows of circuits; and
multiplexer circuits that provide signals between the first portion of a first one of the rows of circuits and the second portion of a second one of the rows of circuits to allow functions for a single row of circuits in a user design for the programmable logic integrated circuit to be performed by the first portion of the first one of the rows of circuits and the second portion of the second one of the rows of circuits if a defect is detected in the first region above the first one of the rows of circuits and a defect is not detected in the second region above the second one of the rows of circuits, and wherein the second one of the rows of circuits is different than the first one of the rows of circuits.

10. The programmable logic integrated circuit of claim 9, wherein the programmable logic integrated circuit shifts functions for a first subset of the rows of circuits to subsequent ones of the rows of circuits in the first region based on the defect in the first region,
wherein the programmable logic integrated circuit shifts functions for a second subset of the rows of circuits to subsequent ones of the rows of circuits in the second region based on a defect in the second region, and wherein the second subset of the rows of circuits comprises at least some of the rows of circuits in the first subset.

11. The programmable logic integrated circuit of claim 9, wherein a third one of the rows of circuits is a redundant row of circuits, and wherein the multiplexer circuits shift down functions for the first portion of a fourth one of the rows of circuits to the redundant row of circuits in the first region.

12. The programmable logic integrated circuit of claim 9, wherein one of the multiplexer circuits in each of the rows of circuits is configurable to provide signals across a boundary between the first and second regions from any one of three wires in three adjacent ones of the rows of circuits to one of the programmable logic circuits in one of the rows of circuits.

13. The programmable logic integrated circuit of claim 9, wherein two of the multiplexer circuits in each of the rows of circuits are configurable to provide signals across a boundary between the first and second regions from any one of three wires in three adjacent ones of the rows of circuits to one of the programmable logic circuits in one of the rows of circuits.

14. The programmable logic integrated circuit of claim 9 further comprising:
a control circuit that generates control signals for controlling the multiplexer circuits, wherein the control circuit is responsive to a first input signal indicating if the first portion of a third one of the rows of circuits contains a defect, and wherein the control circuit is responsive to a second input signal indicating if the second portion of a fourth one of the rows of circuits contains a defect.

15. The programmable logic integrated circuit of claim 14, wherein the control circuit causes the multiplexer circuits to provide signals across a boundary between the first and second regions between the first portion of the first one of the rows of circuits and the second portion of the second one of the rows of circuits to allow functions for a first subset of the rows of circuits to be shifted to subsequent ones of the rows of circuits in the first region based on the defect in the first region.

16. A method for bypassing defects in an integrated circuit, the method comprising:
receiving indications of a first defect in a first region of the integrated circuit and a second defect in a second region of the integrated circuit, wherein the first region comprises a first portion of each of first, second, third, and fourth rows of circuits, wherein the second region comprises a second portion of each of the first, the second, the third, and the fourth rows of circuits,
shifting functions for the first portion of the first row of circuits to the first portion of the second row of circuits to bypass the first defect in the first portion of the first row of circuits, wherein only the first portion of the first row of circuits is disabled; and
shifting functions for the second portion of the third row of circuits to the second portion of the first row of circuits to bypass the second defect in the second portion of the fourth row of circuits, wherein only the second portion of the fourth row of circuits is disabled.

17. The method of claim 16 further comprising:
shifting functions for the first and second portions of a fifth one of the rows of circuits to a redundant row of circuits in both of the first and second regions of the integrated circuit.

18. The method of claim 16 further comprising:
providing signals between the first portion of the third row of circuits and the second portion of the first row of circuits using multiplexer circuits.

19. The method of claim 16, wherein the integrated circuit is a programmable logic integrated circuit, wherein each of the first, the second, the third, and the fourth rows of circuits comprises programmable logic circuit blocks, and wherein a user design for the programmable logic integrated circuit specifies functions to be programmed into the programmable logic circuit blocks.

20. The method of claim 16 further comprising:
providing a signal across a boundary between the first and second regions from any one of three wires in three adjacent rows of circuits to a circuit block in one of the three adjacent rows of circuits using a multiplexer circuit.

* * * * *